(12) United States Patent
Bang et al.

(10) Patent No.: US 7,471,577 B2
(45) Date of Patent: Dec. 30, 2008

(54) VOLTAGE GENERATOR AND METHODS THEREOF

(75) Inventors: Hoon-Jin Bang, Seoul (KR); Hyo-Sang Lee, Yongin-si (KR); Jong-Hoon Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 11/644,895

(22) Filed: Dec. 26, 2006

(65) Prior Publication Data

US 2007/0189085 A1 Aug. 16, 2007

(30) Foreign Application Priority Data

Feb. 14, 2006 (KR) .................. 10-2006-0014245

(51) Int. Cl.
*G11C 7/00* (2006.01)
(52) U.S. Cl. .................. 365/189.09; 365/189.11
(58) Field of Classification Search ............ 365/189.09, 365/189.11, 189.15
See application file for complete search history.

(56) References Cited

U.S. PATENT DOCUMENTS 5,557,193 A 9/1996 Kajimoto
6,492,863 B2 * 12/2002 Kono et al. .................. 327/538

FOREIGN PATENT DOCUMENTS

JP 2005-259222 9/2005
KR 10-2000-0020101 4/2000

* cited by examiner

*Primary Examiner*—Vu A Le
(74) *Attorney, Agent, or Firm*—Harness Dickey Pierce, P.L.C.

(57) ABSTRACT

A voltage generator and methods thereof are provided. The example voltage generator may include a voltage comparison block which generates an output voltage in response to a read command, the output voltage corresponding to a difference between a reference voltage and a determination voltage and a voltage generation block which outputs the determination voltage and a comparison voltage in response to the read command, an inverse read command having a phase opposite that of the read command, a switching pulse signal and the output voltage. A first example method may include outputting a determination voltage and a comparison voltage in response to a read command, an inverse read command having a phase opposite that of the read command, a switching pulse signal and an output voltage, the output voltage generated in response to the read command and corresponding to a difference between the reference voltage and the determination voltage. A second example method may include maintaining a comparison voltage at a first voltage level if a read command is disabled and transitioning the comparison voltage to a second voltage level if the read command is enabled by discharging electric current along a first path, the first path connected to a first node coupled to at least one resistor, and a second path, the second path connected to a second node coupled with a switched capacitor circuit, the switched capacitor circuit including a capacitor which is selectively connected to the second node in response to the enabled read command.

22 Claims, 4 Drawing Sheets

US 7,471,577 B2

VOLTAGE GENERATOR AND METHODS THEREOF

PRIORITY STATEMENT

This application claims the benefit of Korean Patent Application No. 10-2006-0014245, filed on Feb. 14, 2006, in the Korean Intellectual Property Office, the disclosure of which is incorporated herein in its entirety by reference.

BACKGROUND OF THE INVENTION

1. Field of the Invention

Example embodiments of the present invention relate generally to a voltage generator and methods thereof, and more particularly to a voltage generator generating voltages associated with a read operation and methods thereof.

2. Description of the Related Art

Data may be stored in each of a plurality of memory cells of a flash memory as a first logic level (e.g., a higher logic level or logic "1") or a second logic level (e.g., a lower logic level or logic "0"). In order to read data from a memory cell of a flash memory, a read command for the memory cell may be enabled, and a given voltage may be applied to the memory cell. The applied voltage may not be a voltage provided by a pad of the flash memory, but rather may typically be generated inside the flash memory based on electrical characteristics of the memory cell.

The voltage applied to the memory cell to read data from the memory cell may be generated by a voltage generator inside a flash memory. In order to reduce power consumption of the flash memory, the voltage generator may be driven (e.g., operated) only during read operations of the flash memory. Therefore, the speed of reading data from the flash memory may be at least partially dependent on how quickly the voltage generator can generate a voltage to be applied to the flash memory.

FIG. 1 is a circuit diagram of a conventional voltage generator 100. Referring to FIG. 1, the voltage generator 100 may include a voltage comparison block 110 and a voltage generation block 120. The voltage generator 100 may generate a comparison voltage $V_{rd}$ in response to a read command READ and a reference voltage $V_{ref}$.

Referring to FIG. 1, the voltage comparison block 110 may generate an output voltage $V_O$ in response to the read command READ. The output voltage $V_O$ may correspond to a difference between the reference voltage $V_{ref}$ and a determination voltage $V_{det}$. The voltage generation block 120 may output the determination voltage $V_{det}$ and the comparison voltage $V_{rd}$ in response to the read command READ, an inverse read command READB whose phase may be opposite to the phase of the read command READ, and the output voltage $V_O$. The comparison voltage $V_{rd}$ may be used to read data from a flash memory cell.

Conventional operation of the voltage generator 100 will now be described. Below, nodes and voltages output from the respective nodes will now be referenced by the same reference characters. Hereinafter, a comparison voltage and a node from which the comparison voltage may be output are both referenced by reference character $V_{rd}$. Conventional operation will be described wherein the read command READ is enabled (e.g., set to a first logic level, such as a higher logic level or logic "1") and disabled (e.g., set to a second logic level, such as a lower logic level or logic "0").

In conventional operation of the voltage generator 100, if the read command READ is disabled (e.g., set to the second logic level), a third N-type MOS transistor N3 may be turned off, and thus, the voltage comparison block 110 may not operate. A fifth P-type MOS transistor P5 may be turned off, and a fourth P-type MOS transistor P4 may be turned on. Thus, the comparison voltage $V_{rd}$ may be fixed to a voltage level substantially the same as a first power supply voltage $V_{CC}$. Thus, if the read command READ is disabled, the voltage comparison block 110 and the voltage generation block 120 may consume a relatively small amount of power.

In conventional operation of the voltage generator 100, if the read command READ is enabled (e.g., set to the first logic level), the third N-type MOS transistor N3 and the fifth P-type MOS transistor P5 may be turned on, and the fourth P-type MOS transistor P4 may be turned off. Accordingly, the voltage comparison block 110 and the voltage generation block 120 may operate normally.

As discussed above, if the read command READ is disabled, the comparison voltage output node $V_{rd}$ may be precharged to approximately the same voltage level as the first power supply voltage $V_{CC}$. However, if the read command READ is enabled, the determination voltage $V_{det}$ may be determined. The determination voltage $V_{det}$ and the reference voltage $V_{ref}$ may be compared with each other by the voltage comparison block 110, and the output voltage $V_O$, which may be generated as a result of the comparison, may be fed back to the voltage generation block 120. A current supplied by the first power supply voltage $V_{CC}$ may be adjusted by the output voltage $V_O$ controlling the third P-type MOS transistor P3. Then, the determination voltage $V_{det}$, which may be applied to a resistor R2, may be adjusted. The determination voltage $V_{det}$ may be applied to the voltage comparison block 110.

The above-described voltage adjustment operation may be performed repeatedly until the determination voltage $V_{det}$ substantially matches the reference voltage $V_{ref}$. After a given number of repetitions, the comparison voltage $V_{rd}$ may approximate a given voltage level. The comparison voltage $V_{rd}$ may be expressed as follows, $$V_{rd} = V_{det} \times \left(1 + \frac{R1}{R2}\right) \qquad \text{Equation 1}$$

Generally, the faster the comparison voltage $V_{rd}$ is generated after the read command READ is enabled, the more efficient the voltage generator 100. In a semiconductor layout, resistors may be embodied as a plurality of unit rectangles which have a substantially uniform resistance and may be connected in series. Generally, the greater the number of unit rectangles connected in series, the greater the resistance, and the longer the path along which electric charges may be transmitted. Thus, because higher resistance is associated with a longer propagation path, as the resistance of first and second resistors R1 and R2 increases, the speed of generating the comparison voltage $V_{rd}$ may decrease. However, if the resistance of the first and second resistors R1 and R2 is reduced to generate the comparison voltage $V_{rd}$ within a shorter period of time, an amount of direct current transmitted from the first power supply voltage $V_{CC}$ to a second power supply voltage $V_{SS}$ may increase, and thus, the power consumption of the voltage generator 100 may increase. Therefore, it may be difficult to reduce the resistance of the resistors R1 and R2 to generate the comparison voltage $V_{rd}$ more quickly because reducing the resistance may cause an increase to the power consumption of the voltage generator 100.

SUMMARY OF THE INVENTION

An example embodiment of the present invention is directed to a voltage generator, including a voltage comparison block which generates an output voltage in response to a read command, the output voltage corresponding to a difference between a reference voltage and a determination voltage and a voltage generation block which outputs the determination voltage and a comparison voltage in response to the read command, an inverse read command having a phase opposite that of the read command, a switching pulse signal and the output voltage.

Another example embodiment of the present invention is directed to a method of generating voltage, including outputting a determination voltage and a comparison voltage in response to a read command, an inverse read command having a phase opposite that of the read command, a switching pulse signal and an output voltage, the output voltage generated in response to the read command and corresponding to a difference between the reference voltage and the determination voltage.

Another example embodiment of the present invention is directed to a method of generating voltage, including maintaining a comparison voltage at a first voltage level if a read command is disabled and transitioning the comparison voltage to a second voltage level if the read command is enabled by discharging electric current along a first path, the first path connected to a first node coupled to at least one resistor, and a second path, the second path connected to a second node coupled with a switched capacitor circuit, the switched capacitor circuit including a capacitor which is selectively connected to the second node in response to the enabled read command.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
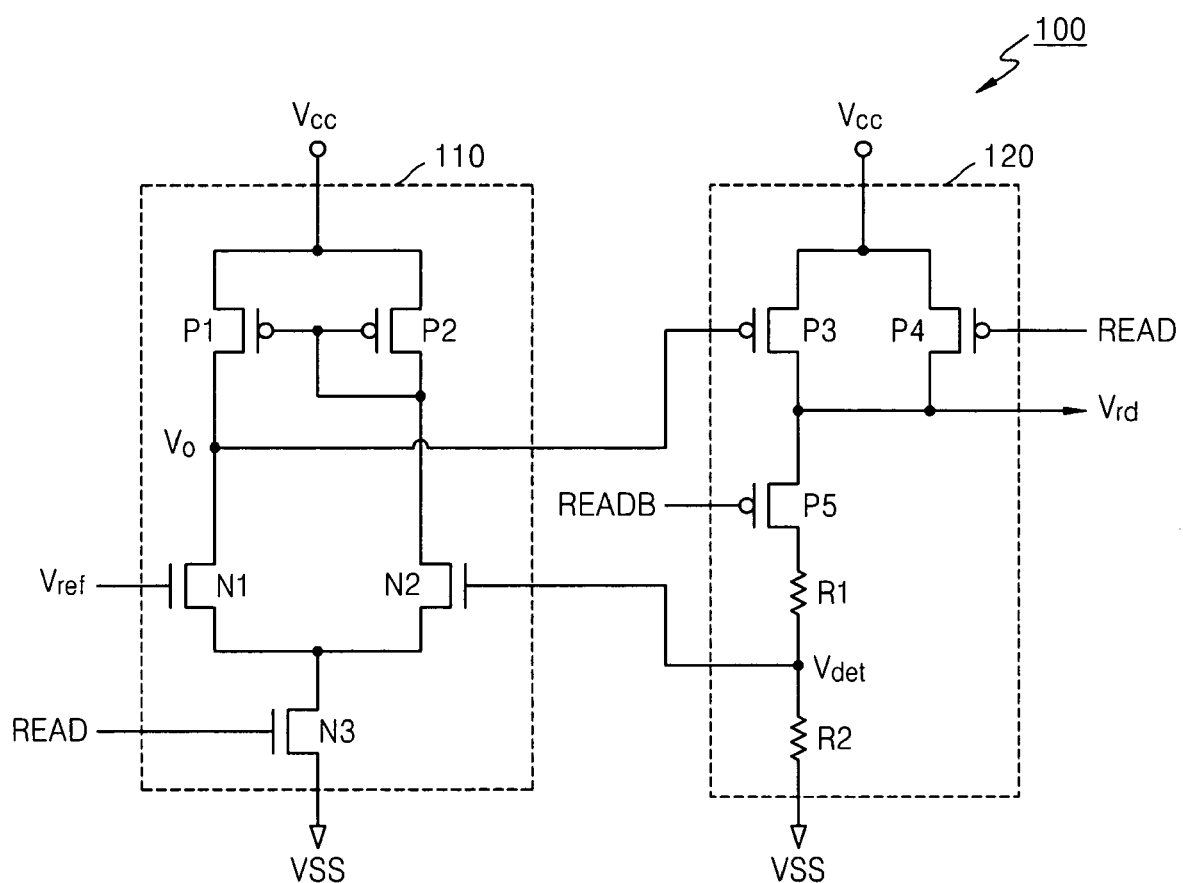
FIG. 1 is a circuit diagram of a conventional voltage generator.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
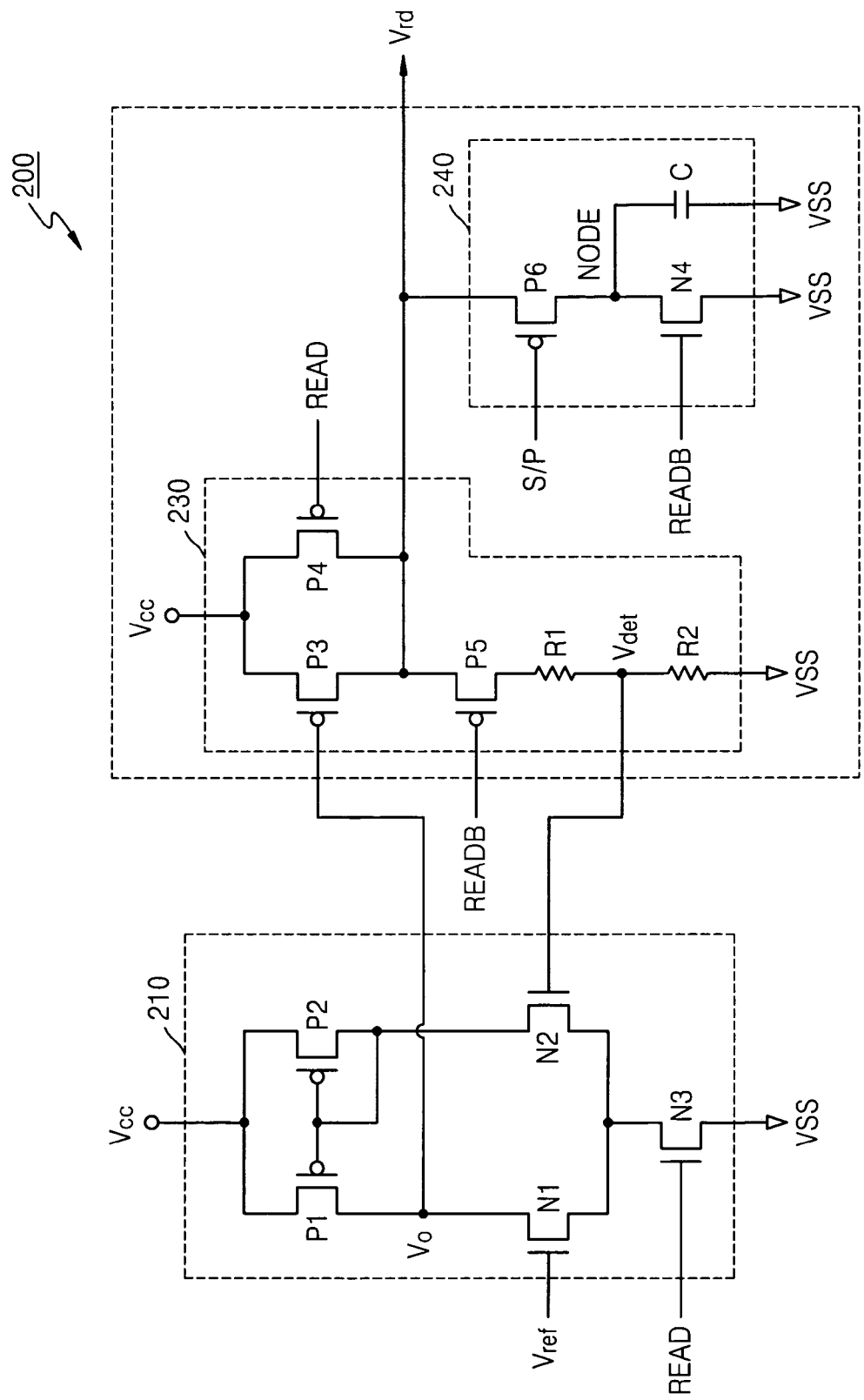
FIG. 2 is a circuit diagram of a voltage generator according to an example embodiment of the present invention.

FIG. 2 is a circuit diagram of a voltage generator 200 according to an example embodiment of the present invention. In the example embodiment of FIG. 2, the voltage generator 200 may include a voltage comparison block 210 and a voltage generation block 220.

In the example embodiment of FIG. 2, the voltage comparison block 210 may generate an output voltage $V_O$ in response to a read command READ. The output voltage $V_O$ may correspond to a difference between a reference voltage $V_{ref}$ and a determination voltage $V_{det}$. In an example, the voltage comparison block 210 may be embodied input stage of a typical differential operation amplifier. The voltage comparison block 210 may include first and second P-type MOS transistors P1 and P2, and first, second and third N-type MOS transistors N1, N2, and N3.

In the example embodiment of FIG. 2, a first terminal of the first P-type MOS transistor P1 may be connected to a first power supply voltage $V_{CC}$, and a second terminal of the first P-type MOS transistor P1 may be connected to an output voltage output node $V_O$ from which the output voltage $V_O$ may be output. A first terminal of the second P-type MOS transistor P2 may be connected to the first power supply voltage $V_{CC}$, and a second terminal of the second P-type MOS transistor P2 may be connected to the gate of the second P-type MOS transistor P2 and the gate of the first P-type MOS transistor P1. A first terminal of the first N-type MOS transistor N1 may be connected to the output voltage output node $V_O$, a gate of the first N-type MOS transistor N1 may receive the reference voltage $V_{ref}$. A first terminal of the second N-type MOS transistor N2 may be connected to the second terminal of the second P-type MOS transistor P2, and a gate of the second N-type MOS transistor N2 may receive the determination voltage $V_{det}$. A first terminal of the third N-type MOS transistor N3 may be connected to the second terminal of the first N-type MOS transistor N1 and the second terminal of the second N-type MOS transistor, and a second terminal of the third N-type MOS transistor N3 may be connected to a second power supply voltage $V_{SS}$. The read command READ may be applied to the gate of the third N-type MOS transistor N3.

In the example embodiment of FIG. 2, the voltage generation block 220 may output the determination voltage $V_{det}$ and the comparison voltage $V_{rd}$ in response to the read command READ, an inverse read command READB having a phase opposite that of the phase of the read command READ, a switching pulse signal S/P and the output voltage $V_O$. The voltage generation block 220 may include a voltage division circuit 230 and a switched capacitor 240.

In the example embodiment of FIG. 2, the voltage division circuit 230 may output the determination voltage $V_{det}$ and the comparison voltage $V_{rd}$ in response to the read command READ, the inverse read command READB and the output voltage $V_O$. The voltage division circuit 230 may include first, second and third P-type MOS transistors P3, P4, and P5, and first and second resistors R1 and R2.

In the example embodiment of FIG. 2, a first terminal of the third P-type MOS transistor P3 may be connected to the first power supply voltage $V_{CC}$, and a second terminal of the third P-type MOS transistor P3 may be connected to a comparison voltage output node $V_{rd}$ (e.g., which may output the comparison voltage $V_{rd}$). The output voltage $V_O$ may be applied to a gate of the third P-type MOS transistor P3. A first terminal of the fourth P-type MOS transistor P4 may be connected to the first power supply voltage $V_{CC}$, and a second terminal of the fourth P-type MOS transistor P4 may be connected to the comparison voltage output node $V_{rd}$. The read command may be applied to the gate of the fourth P-type MOS transistor P4. A first terminal of the fifth P-type MOS transistor P5 may be connected to the comparison voltage output node $V_{rd}$, and the inverse read command READB may be applied to a gate of the fifth P-type MOS transistor P5. A first terminal of the first resistor R1 may be connected to the second terminal of the fifth P-type MOS transistor P5, and a second terminal of the first resistor R1 may be connected to a determination voltage output node $V_{det}$ from which the determination voltage $V_{det}$ may be output. A first terminal of the second resistor R2 may be connected to the determination voltage output node $V_{det}$, and a second terminal of the second resistor R2 may be connected to the second power supply voltage $V_{SS}$.

In the example embodiment of FIG. 2, the switched capacitor circuit 240 may adjust the comparison voltage $V_{rd}$ in response to the inverse read command READB and the switching pulse signal S/P. The switched capacitor circuit 240 may include two MOS transistors (e.g., a sixth P-type MOS transistor P6 and a fourth N-type MOS transistor N4), and a capacitor C.

In the example embodiment of FIG. 2, a first terminal of the sixth P-type MOS transistor P6 may be connected to the comparison voltage output node $V_{rd}$, and the switching pulse signal S/P may be applied to a gate of the sixth P-type MOS transistor P6. A first terminal of the fourth N-type MOS transistor N4 may be connected to a second terminal of the sixth P-type MOS transistor P6, and a second terminal of the fourth N-type MOS transistor N4 may be connected to the second power supply voltage $V_{SS}$. The inverse read command READB may be applied to a gate of the fourth N-type MOS transistor N4. A first terminal of the capacitor C may be connected to a common node between the sixth P-type MOS transistor P6 and the fourth N-type MOS transistor N4, and a second terminal of the capacitor C may be connected to the second power supply voltage $V_{SS}$.

In example operation of the voltage generator 200 of FIG. 2, if the read command READ (e.g., a command to read data from a memory cell) is not enabled (e.g., set to the second logic level, such as a lower logic level or logic "0"), the fourth N-type MOS transistor N4 of the switched capacitor circuit 240 may be turned on in response to the inverse read command READB (e.g., with the same amplitude and an opposite phase with respect to the read command READ). Accordingly, the capacitor C may be discharged. Then, the comparison voltage $V_{rd}$ may transition to a voltage level approximating the first power supply voltage $V_{CC}$.

In example operation of the voltage generator 200 of FIG. 2, if the read command READ is enabled (e.g., set to the first logic level, such as a higher logic level or logic "1"), the switching pulse signal S/P may be enabled (e.g., set to the first logic level) for a given period of time. By using the switching pulse signal S/P, electric charges precharged to the comparison voltage output node $V_{rd}$ may be distributed to a node NODE of the capacitor C. The number of electric charges stored in the comparison voltage output node $V_{rd}$ may vary based on the first power supply voltage $V_{CC}$. Thus, generally, the higher the first power supply voltage $V_{CC}$, the greater the number of electric charges stored in the comparison voltage output node $V_{rd}$. Therefore, if a higher amount of electric charge is stored in the comparison voltage output node $V_{rd}$, a longer amount of time may be required for the comparison voltage output node $V_{rd}$ to share the electric charges with the node NODE of the capacitor C. The comparison voltage output node $V_{rd}$ may switch the sixth P-type MOS transistor P6 in response to the switching pulse signal S/P. Thus, electric charges may be shared on a conductive path between the comparison voltage output node $V_{rd}$ and the node NODE of the capacitor C. A period of time for a switch to be short-circuited may be adjusted via the first power supply voltage $V_{CC}$ by adjusting a width of the switching pulse signal S/P (e.g., to be proportional to the first power supply voltage $V_{CC}$). A switching pulse signal generator 300, which may generate a switching pulse signal S/P having a width proportional to the first power supply voltage $V_{CC}$, will be described later in greater detail.

Referring again to the conventional voltage generator 100 illustrated in FIG. 1, if the determination voltage $V_{det}$ is lower than the reference voltage $V_{ref}$, the output voltage $V_O$ may decrease. The output voltage $V_O$ may transmit through the third P-type MOS transistor P3 and may adjust a number of electric charges supplied from the first power supply voltage $V_{CC}$ to the comparison voltage output node $V_{rd}$. Alternatively, if the determination voltage $V_{det}$ is higher than the reference voltage $V_{ref}$, the output voltage $V_O$ may increase such that the supply of electric charges from the third P-type MOS transistor P3 may be reduced (e.g., cut off). The comparison voltage output node $V_{rd}$ may be discharged via the sixth P-type MOS transistor P6 and the second power supply voltage $V_{SS}$. Thus, the determination voltage $V_{det}$ and the reference voltage $V_{ref}$ may be maintained at substantially the same voltage level. As described above, it may take a considerable amount of time for the conventional voltage generator 100 to discharge the comparison voltage output node $V_{rd}$ because the first and second resistors R1 and R2, which are connected in series, may constitute the only path on which to discharge electric charges from the comparison voltage output node $V_{rd}$.

Returning to the example embodiment of FIG. 2, the voltage generator 200 may supply electric charges to the comparison voltage output node $V_{rd}$ with the aid of the switched capacitor circuit 240. Thus, it will be appreciated by one of ordinary skill in the art that the voltage generator 200 may more quickly increase the voltage of the comparison voltage output node $V_{rd}$. In addition, electric charges stored in the comparison voltage output node $V_{rd}$ may be distributed to the capacitor C, and the number of electric charges required to be discharged from the comparison voltage output node $V_{rd}$ may thereby be relatively small. Accordingly, the comparison voltage output node $V_{rd}$ may be discharged at higher speeds than the conventional voltage generator 100 of FIG. 1. Thus, the voltage generator 200 may reduce a period of time required to charge the comparison voltage output node $V_{rd}$ by adding an additional charge path, and may further reduce a period of time required to discharge the comparison voltage output node $V_{rd}$ by distributing electric charges stored in the comparison voltage output node $V_{rd}$.

In the example embodiment of FIG. 2, a given period of time after the switching pulse signal S/P is enabled, the switching pulse signal S/P may be disabled, thereby reducing a likelihood that the capacitor C may act as a capacitive load of the comparison voltage output node $V_{rd}$.

Figure 3:
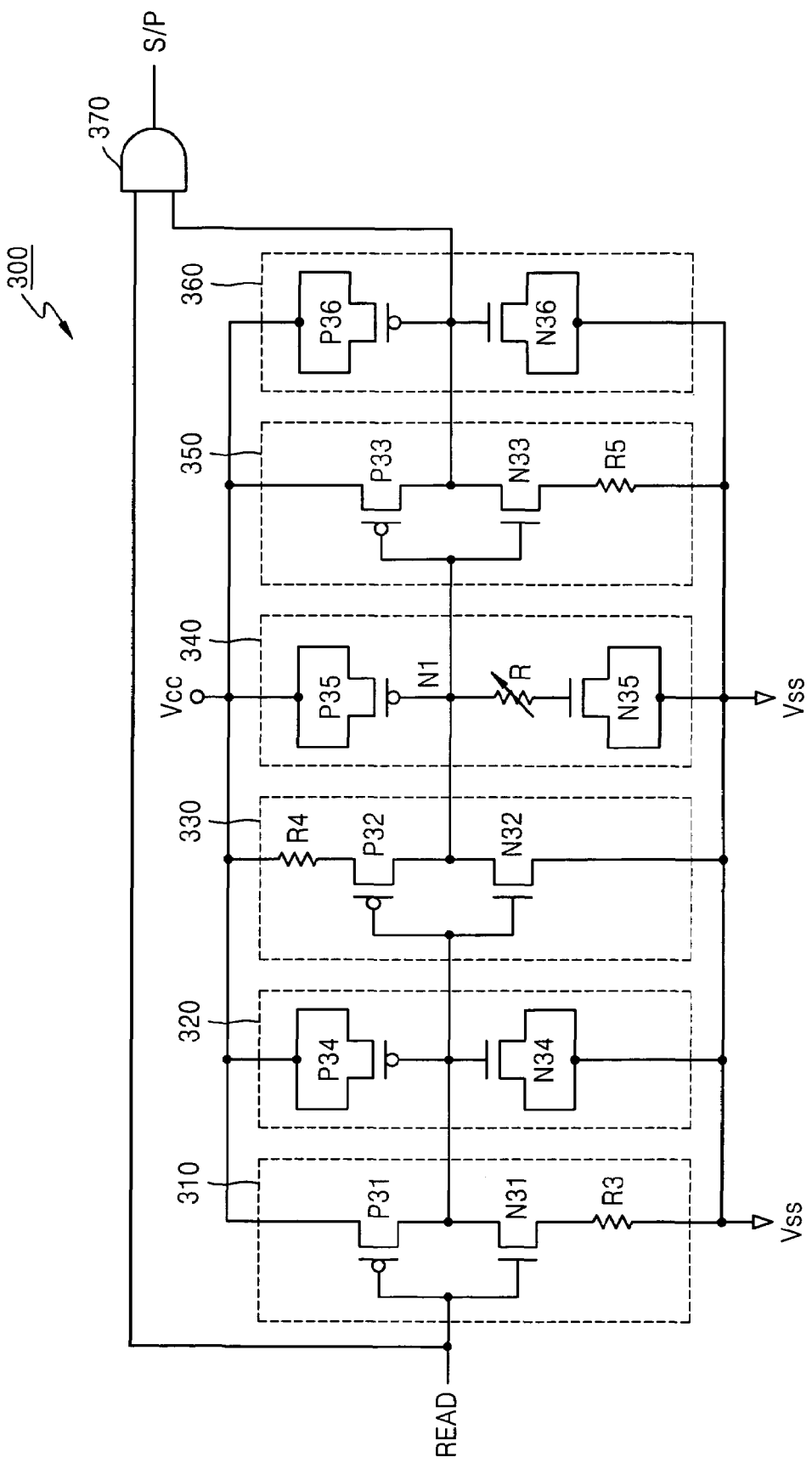
FIG. 3 is a circuit diagram illustrating a switching pulse generator according to another example embodiment of the present invention.

FIG. 3 is a circuit diagram illustrating a switching pulse generator 300 according to another example embodiment of the present invention. In an example, while not illustrated in FIG. 2, the switching pulse generator 300 of FIG. 3 may be included within the voltage generator 200 of FIG. 2. In the example embodiment of FIG. 3, the switching pulse generator 300 may include first, second and third inverters 310, 330, and 350, first and second MOS capacitor blocks 320 and 360, a switching pulse width modulation block 340 and a NAND gate 370.

In the example embodiment of FIG. 3, the first, second, and third inverters 310, 330, and 350 may be connected in series, and the read command READ may be applied to the first inverter 310. The first inverter 310 may include a P-type MOS transistor P31, an N-type MOS transistor N31 and a resistor R3. The second inverter 330 may include a P-type MOS transistor P32, an N-type MOS transistor N32 and a resistor R4. The third inverter 350 may include a P-type MOS transistor P33, an N-type MOS transistor N33 and a resistor R5. In an example, the first, second and third inverters 310, 330, and 350 may be distinguished based on whether their respective internal resistors are connected to the first power supply voltage $V_{CC}$ or the second power supply voltage $V_{SS}$. Further, while the first, second, and third inverters 310, 330, and 350 are illustrated in FIG. 3 as being connected in series, it is understood that the first, second and third inverters 310, 330 and 350 need not be connected in series and/or be limited to three inverters in other example embodiments of the present invention. For example, the switching pulse generator 300 may include any odd number of inverters (e.g., 5, 7, 9, etc.) in other example embodiments of the present invention.

In the example embodiment of FIG. 3, the first MOS capacitor block 320 may include two MOS capacitors P34 and N34. The drain and source of each of the MOS capacitors P34 and N34 may be short-circuited and may thereby function as a first electrode, and the gate of each of the MOS capacitor P34 and N34 may function as a second electrode. The first electrode of the MOS transistor P34 may be connected to the first power supply voltage $V_{CC}$, and the first electrode of the MOS transistor N34 may be connected to the second power supply voltage $V_{SS}$. The second electrodes of the MOS transistors P34 and N34 may each be connected to an output port of the first inverter 310. The second MOS capacitor block 360 may include two MOS capacitors P36 and N36. A first electrode of the MOS transistor P36 may be connected to the first power supply voltage $V_{CC}$, and a first electrode of the MOS transistor N36 may be connected to the second power supply voltage $V_{SS}$. Second electrodes of the MOS transistors P36 and N36, respectively, may be connected to an output port of the third inverter 350.

In the example embodiment of FIG. 3, the switching pulse width modulation block 340 may include two MOS capacitors P35 and N35, and a variable resistor R. A first electrode of the MOS capacitor P35 may be connected to the first power supply voltage $V_{CC}$, and a second electrode of the MOS capacitor P35 may be connected to an output port of the second inverter 330. A first terminal of the variable resistor R may be connected to the output port of the second inverter 330. A first electrode of the MOS capacitor N35 may be connected to a second terminal of the variable resistor R, and a second electrode of the MOS capacitor N35 may be connected to the second power supply voltage $V_{SS}$. In an example, the resistance of the variable resistor R may vary based on the first power supply voltage $V_{CC}$. For example, if the first power supply voltage $V_{CC}$ increases, the resistance of the variable resistor R may decrease, and vice versa.

In the example embodiment of FIG. 3, the NAND gate 370 may output the switching pulse signal S/P in response to the read command READ and an output of the third inverter 350.

Figure 4:
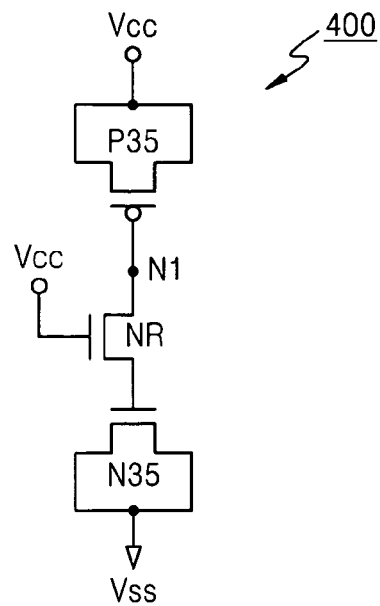
FIG. 4 is a circuit diagram of a switching pulse width modulation block according to another example embodiment of the present invention.

FIG. 4 is a circuit diagram of a switching pulse width modulation block 400 according to another example embodiment of the present invention. In an example, the switching pulse width modulation block 400 of FIG. 4 may be representative of the switching pulse width modulation block 340 of FIG. 3. In the example embodiment of FIG. 4, the variable resistor R of the switching pulse width modulation block 340 of FIG. 3 may be embodied as an N-type MOS transistor NR having a gate to which the first power supply voltage $V_{CC}$ is applied.

Figure 5:
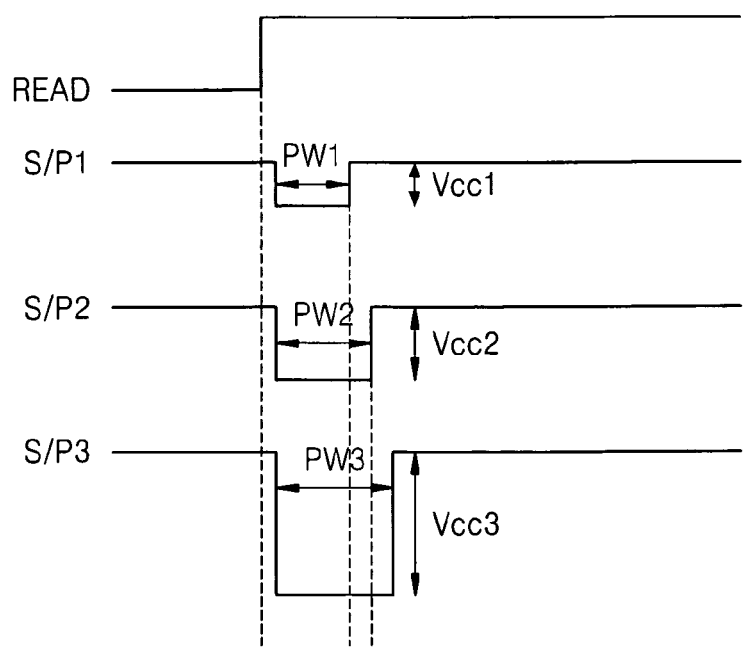
FIG. 5 is a timing diagram illustrating waveforms of a plurality of switching pulse signals generated by the switching pulse generator of FIG. 3 according to another example embodiment of the present invention.

FIG. 5 is a timing diagram illustrating waveforms of a plurality of switching pulse signals generated by the switching pulse generator 300 of FIG. 3 according to another example embodiment of the present invention.

In the example embodiment of FIG. 5, an amplitude and width of a switching pulse signal may vary according to a first power supply voltage. For example, the amplitude of a first switching pulse signal S/P1 corresponding to a first power supply voltage $V_{CC}1$, which may be lower than a second power supply voltage $V_{CC}2$, may be lower than the amplitude of a second switching pulse signal S/P2 corresponding to the second power supply voltage $V_{CC}2$. In a further example, the width PW1 of the first switching pulse signal S/P1 may be less than the width PW2 of the second switching pulse signal S/P2. Likewise, the amplitude of the second switching pulse signal S/P2 may be lower than the amplitude of a third switching pulse signal S/P3 corresponding to a third power supply voltage $V_{CC}3$, which may be higher than the second power supply voltage $V_{CC}2$, and the width PW2 of the second switching pulse signal S/P2 may be less than the width PW3 of the third switching pulse signal S/P3.

Example operation of the switching pulse generator 300 will now be described in greater detail with reference to FIGS. 3 through 5.

In example operation of the switching pulse generator 300 of FIG. 3, the first, second, and third inverters 310, 330, and 350 may invert the phase of the read command READ. In order to maintain a result of the inversion for a given time period, the first and second MOS capacitor blocks 320 and 360 and the switching pulse width modulation block 340 may be employed. The switching pulse width modulation block 340 may adjust a duration of the read command READ based on the first power supply voltage $V_{CC}$.

In example operation of the switching pulse generator 300 of FIG. 3, a period of time in which a capacitor C (e.g., which may be connected to a resistor R in series) is discharged may be proportional to 1/RC. Thus, it will be appreciated by one of ordinary skill in the art that the higher resistance values of the resistor R may be associated with shorter discharge durations of the capacitor C. Conversely, lower resistance values of the resistor R may be associated with longer discharge durations of the capacitor C.

In example operation of the switching pulse generator 300 of FIG. 3, if the resistance of the variable resistor R of the switching pulse width modulation block 340 is adjusted based on the first power supply voltage $V_{CC}$, the width of the switching pulse signal S/P may likewise be changed. In an example, if the first power supply voltage $V_{CC}$ is increased and the resistance of the resistor R is reduced, a discharge duration of electric charges through the variable resistor R and the MOS capacitor N35, which may be connected in series, may increase, thereby increasing a propagation delay time. Accordingly, the width of the switching pulse signal S/P may likewise increase. In an alternative example, if the first power supply voltage $V_{CC}$ is reduced and the resistance of the resistor R is increased, a discharge duration of electric charges through the variable resistor R and the MOS capacitor N35 may be reduced, thereby reducing a propagation delay time. Accordingly, the width of the switching pulse signal S/P may likewise decrease.

In example operation of the switching pulse generator 300 of FIG. 3, the read command READ may be applied to a first input terminal of the NAND gate 370, and a signal obtained by inverting the phase of the read command READ and delaying the result of the inversion may be applied to a second input terminal of the NAND gate 370, thereby generating a pulse signal having a width which may be based upon a delay incurred by the inversion.

In another example embodiment of the present invention, a voltage generator may generate a target voltage at higher speeds without significantly increasing a power consumption of the voltage generator.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:
1. A voltage generator, comprising:
a voltage comparison block which generates an output voltage in response to a read command, the output voltage corresponding to a difference between a reference voltage and a determination voltage; and a voltage generation block which outputs the determination voltage and a comparison voltage in response to the read command, an inverse read command having a phase opposite that of the read command, a switching pulse signal and the output voltage.

2. The voltage generator of claim 1, wherein the voltage comparison block includes:
   a first P-type MOS transistor which has a first terminal connected to a first power supply voltage and a second terminal connected to an output node outputting the output voltage;
   a second P-type MOS transistor which has a first terminal connected to the first power supply voltage and a second terminal connected to the gate of the second P-type MOS transistor and the gate of the first P-type MOS transistor;
   a first N-type MOS transistor which has a first terminal connected to the output voltage output node and a gate receiving the reference voltage;
   a second N-type MOS transistor which has a first terminal connected to the second terminal of the second P-type MOS transistor and a gate receiving the determination voltage; and
   a third N-type MOS transistor which has a first terminal connected to the second terminal of the first N-type MOS transistor and the second terminal of the second N-type MOS transistor, a second terminal connected to a second power supply voltage, and a gate receiving the read command.

3. The voltage generator of claim 1, wherein the voltage generation block includes:
   a voltage division circuit configured to output the determination voltage and the comparison voltage in response to the read command, the inverse read command and the output voltage; and
   a switched capacitor which adjusts the comparison voltage in response to the inverse read command and the switching pulse signal.

4. The voltage generator of claim 3, wherein the voltage division circuit includes:
   a first P-type MOS transistor which has a first terminal connected to the first power supply voltage, a second terminal connected to a comparison voltage output node from which the comparison voltage is output, and a gate to which the output voltage is applied;
   a second P-type MOS transistor which has a first terminal connected to the first power supply voltage, a second terminal connected to the comparison voltage output node, and a gate to which the read command is applied;
   a third P-type MOS transistor which has a first terminal connected to the comparison voltage output node and a gate to which the inverse read command is applied;
   a first resistor which has a first terminal connected to the second terminal of the third P-type MOS transistor and a second terminal connected to a determination voltage output node from which the determination voltage is output; and
   a second resistor which has a first terminal connected to the determination voltage output node and a second terminal connected to the second power supply voltage.

5. The voltage generator of claim 3, wherein the switched capacitor circuit includes:
   a P-type MOS transistor which has a first terminal connected to a comparison voltage output node and a gate to which the switching pulse signal is applied;
   an N-type MOS transistor which has a first terminal connected to the second terminal of the P-type MOS transistor, a second terminal connected to the second power supply voltage, and a gate to which the inverse read command is applied; and
   a capacitor which has a first terminal connected to the P-type MOS transistor and the N-type MOS transistor and a second terminal connected to the second power supply voltage.

6. The voltage generator of claim 1, further comprising:
   a reference voltage generation circuit generating the reference voltage, in the reference voltage being substantially stable in response to variations in a power supply voltage supplied to the reference voltage generation circuit and variations in temperature.

7. The voltage generator of claim 1, wherein an amplitude and width of the switching pulse signal may vary based on a power supply voltage supplied to the voltage generator.

8. The voltage generator of claim 7, wherein, if the power supply voltage is set to relatively high levels, the amplitude of the switching pulse signal is higher and the width of the switching pulse signal is longer, and, if the power supply voltage is set to relatively low levels, the amplitude of the switching pulse signal is lower and the width of the switching pulse signal is shorter.

9. The voltage generator of claim 1, further comprising:
   a switching pulse generator which generates the switching pulse signal in response to the read command.

10. The voltage generator of claim 9, wherein the switching pulse generator includes:
    a first inverter which inverts the phase of the read command;
    a first capacitor block providing a capacitive load for a first signal output by the first inverter;
    a second inverter which inverts the phase of the first signal output by the first inverter;
    a switching pulse width modulation block which provides a capacitive load for a second signal output by the second inverter and adjusts a delay time of the second signal output by the second inverter based on a power supply voltage;
    a third inverter which inverts the phase of the second signal output by the second inverter;
    a second capacitor block which provides a capacitive load for a third signal output by the third inverter; and
    a NAND gate which outputs the switching pulse signal in response to the read command and the third signal output by the third inverter.

11. The voltage generator of claim 10, wherein the first through third inverters are each one of a first-type and a second-type.

12. The voltage generator of claim 11, wherein an inverter of the first type includes:
    a first-type inverter P-type MOS transistor which has a first terminal connected to a first power supply voltage and a second terminal connected to an output port;
    a first-type inverter N-type MOS transistor which has a first terminal connected to the output port and a gate connected to the gate of the first-type inverter P-type MOS transistor; and
    a first-type inverter resistor which has a first terminal connected to a second terminal of the first-type inverter N-type MOS transistor and a second terminal connected to a second power supply voltage.

13. The voltage generator of claim 11, wherein an inverter of the second type includes:
    a second-type inverter resistor which has a first terminal connected to a first power supply voltage;

a second-type inverter P-type MOS transistor which has a first terminal connected to a second terminal of the second-type inverter resistor and a second terminal connected to an output port; and an N-type MOS transistor which has a first terminal connected to the output port and a gate connected to the gate of the second-type inverter N-type MOS transistor.

14. The voltage generator of claim 11, wherein the switching pulse generator includes an odd number of inverters which are connected in series, the odd number of inverters arranged such that each inverter has a different type than an adjacent inverter.

15. The voltage generator of claim 10, wherein each of the first capacitor block and the second capacitor block includes:
a P-type MOS capacitor which has a first electrode connected to a first power supply voltage and a second electrode connected to an output port of the first inverter; and
an N-type MOS capacitor which has a first electrode connected to a second power supply voltage and a second electrode connected to the output port of the first inverter.

16. The voltage generator of claim 15, wherein the first electrode of the P-type MOS capacitor includes a drain and a source of the P-type MOS capacitor which are connected to each other, the second electrode of the P-type MOS capacitor includes a gate of the P-type MOS capacitor, the first electrode of the N-type MOS capacitor includes a drain and a source of the N-type MOS capacitor which are connected to each other, and the second electrode of the N-type MOS capacitor includes a gate of the N-type MOS capacitor.

17. The voltage generator of claim 10, wherein the switching pulse width modulation block includes:
a P-type MOS capacitor which has a first electrode connected to a first power supply voltage and a second electrode connected to an output port of the second inverter;
a variable resistor which has a first terminal connected to the output port of the second inverter; and
an N-type MOS capacitor which has a first electrode connected to a second power supply voltage and a second electrode connected to a second terminal of the variable resistor.

18. The voltage generator of claim 17, wherein the resistance of the variable resistor varies based on at least one of the first power supply voltage and the second power supply voltage.

19. The voltage generator of claim 18, wherein the resistance of the variable resistor is inversely proportional to the first power supply voltage.

20. The voltage generator of claim 17, wherein the variable resistor includes an N-type MOS transistor which has a first terminal connected to the output port of the second inverter, a second terminal connected to the second terminal of the N-type MOS capacitor, and a gate to which the first power supply voltage is applied.

21. A method of generating voltage, comprising:
outputting a determination voltage and a comparison voltage in response to a read command, an inverse read command having a phase opposite that of the read command, a switching pulse signal and an output voltage, the output voltage generated in response to the read command and corresponding to a difference between the reference voltage and the determination voltage.

22. A method of generating voltage, comprising:
maintaining a comparison voltage at a first voltage level if a read command is disabled; and
transitioning the comparison voltage to a second voltage level if the read command is enabled by discharging electric current along a first path, the first path connected to a first node coupled to at least one resistor, and a second path, the second path connected to a second node coupled with a switched capacitor circuit, the switched capacitor circuit including a capacitor which is selectively connected to the second node in response to the enabled read command.

* * * * *